(12) United States Patent
Bae

(10) Patent No.: US 7,867,885 B2
(45) Date of Patent: Jan. 11, 2011

(54) POST STRUCTURE, SEMICONDUCTOR DEVICE AND LIGHT EMITTING DEVICE USING THE STRUCTURE, AND METHOD FOR FORMING THE SAME

(75) Inventor: Duk Kyu Bae, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/709,153

(22) Filed: Feb. 22, 2007

(65) Prior Publication Data
US 2007/0224831 A1    Sep. 27, 2007

(30) Foreign Application Priority Data
Mar. 23, 2006    (KR)    ............ 10-2006-0026632

(51) Int. Cl.
*H01L 21/44*    (2006.01)
(52) U.S. Cl. .............. 438/597; 257/571; 257/586; 257/739; 257/E21.013; 257/E21.014
(58) Field of Classification Search ............. 438/597
See application file for complete search history.

(56) References Cited

U.S. PATENT DOCUMENTS

| | | | |
|---|---|---|---|
| 4,032,945 A * | 6/1977 | Mori et al. ............... 257/95 |
| 5,393,993 A * | 2/1995 | Edmond et al. ........... 257/77 |
| 5,674,325 A * | 10/1997 | Albright et al. .......... 136/250 |
| 6,185,238 B1 * | 2/2001 | Onomura et al. ....... 372/46.01 |
| 6,265,289 B1 * | 7/2001 | Zheleva et al. .......... 438/503 |
| 6,291,839 B1 * | 9/2001 | Lester .................... 257/91 |
| 6,420,732 B1 * | 7/2002 | Kung et al. ............... 257/79 |

(Continued)

FOREIGN PATENT DOCUMENTS

EP    1 562 238 A2    10/2005

(Continued)

OTHER PUBLICATIONS

Hock et al: "Pattering GaN Microstructures by Polarity-Selective Chemical Etching" Japanese Journal of Applied Physics, Japan Society of Applied Physics, JP LNKD-DOI:10.1143/JJAP.42.1405, vol. 42. No. 12A, Dec. 1, 2003, pp. 1405-1407, XP002991502 Ma et al: "A novel silicon bulk micromachining process for sub-millimetre rectangular waveguide fabrication" ISSN:0021-4922.

(Continued)

*Primary Examiner*—Fernando L Toledo
*Assistant Examiner*—Ankush k Singal
(74) *Attorney, Agent, or Firm*—Birch, Stewart, Kolasch & Birch, LLP

(57) ABSTRACT

A nanometer-scale post structure and a method for forming the same are disclosed. More particularly, a post structure, a light emitting device using the structure, and a method for forming the same, which is capable of forming a nanometer-scale post structure having a repetitive pattern by using an etching process, are disclosed. The method includes forming unit patterns on a substrate by use of a first material, growing a wet-etchable second material on the substrate formed with the unit patterns, and wet etching the substrate having the grown second material.

23 Claims, 9 Drawing Sheets

U.S. PATENT DOCUMENTS

| | | | |
|---|---|---|---|
| 6,465,808 B2* | 10/2002 | Lin | 257/81 |
| 6,495,862 B1* | 12/2002 | Okazaki et al. | 257/103 |
| 6,500,747 B1* | 12/2002 | Lee et al. | 438/604 |
| 6,504,180 B1* | 1/2003 | Heremans et al. | 257/98 |
| 6,522,063 B2* | 2/2003 | Chen et al. | 313/498 |
| 6,620,996 B2* | 9/2003 | Sugawara et al. | 136/250 |
| 6,649,437 B1* | 11/2003 | Yang et al. | 438/30 |
| 6,657,236 B1* | 12/2003 | Thibeault et al. | 257/98 |
| 6,674,778 B1* | 1/2004 | Lin et al. | 372/46.01 |
| 6,686,218 B2* | 2/2004 | Lin et al. | 438/29 |
| 6,762,069 B2* | 7/2004 | Huang et al. | 438/22 |
| 6,787,383 B2* | 9/2004 | Ikeda et al. | 438/44 |
| 6,797,987 B2* | 9/2004 | Chen | 257/98 |
| 6,847,057 B1* | 1/2005 | Gardner et al. | 257/99 |
| 6,869,820 B2* | 3/2005 | Chen | 438/79 |
| 6,903,374 B2* | 6/2005 | Katayama | 257/79 |
| 6,917,457 B2* | 7/2005 | Otsuka et al. | 359/254 |
| 6,919,944 B2* | 7/2005 | Maeda | 349/113 |
| 6,927,444 B2* | 8/2005 | Park et al. | 257/306 |
| 6,946,597 B2* | 9/2005 | Sager et al. | 136/263 |
| 6,972,438 B2* | 12/2005 | Li et al. | 257/98 |
| 6,977,953 B2* | 12/2005 | Hata et al. | 372/46.01 |
| 7,049,635 B2* | 5/2006 | Sano et al. | 257/79 |
| 7,049,638 B2* | 5/2006 | Wu et al. | 257/97 |
| 7,187,007 B2* | 3/2007 | Kim et al. | 257/79 |
| 7,195,993 B2* | 3/2007 | Zheleva et al. | 438/503 |
| 7,244,407 B2* | 7/2007 | Chen et al. | 423/445 B |
| 7,244,957 B2* | 7/2007 | Nakajo et al. | 257/13 |
| 7,250,635 B2* | 7/2007 | Lee et al. | 257/98 |
| 7,317,212 B2* | 1/2008 | Shin | 257/98 |
| 7,384,808 B2* | 6/2008 | Liu et al. | 438/29 |
| 7,385,226 B2* | 6/2008 | Ou et al. | 257/95 |
| 7,419,912 B2* | 9/2008 | Donofrio | 438/694 |
| 7,422,915 B2* | 9/2008 | Chen | 438/22 |
| 7,442,964 B2* | 10/2008 | Wierer et al. | 257/98 |
| 7,485,897 B2* | 2/2009 | Seong et al. | 257/81 |
| 7,521,273 B2* | 4/2009 | Erchak et al. | 438/29 |
| 7,560,737 B2* | 7/2009 | Murofushi et al. | 257/79 |
| 2002/0063256 A1 | 5/2002 | Lin | 257/79 |
| 2002/0158572 A1* | 10/2002 | Chen et al. | 313/498 |
| 2002/0175408 A1 | 11/2002 | Majumdar et al. | |
| 2002/0195609 A1* | 12/2002 | Yoshitake et al. | 257/81 |
| 2003/0123003 A1* | 7/2003 | Choi et al. | 349/113 |
| 2003/0213428 A1 | 11/2003 | Lu et al. | |
| 2004/0084080 A1* | 5/2004 | Sager et al. | 136/263 |
| 2004/0109666 A1* | 6/2004 | Kim, II | 385/147 |
| 2004/0170356 A1* | 9/2004 | Iazikov et al. | 385/37 |
| 2005/0141240 A1* | 6/2005 | Hata et al. | 362/600 |
| 2005/0145876 A1* | 7/2005 | Kwak et al. | 257/103 |
| 2005/0145877 A1* | 7/2005 | Erchak | 257/103 |
| 2005/0161696 A1* | 7/2005 | Yuri | 257/103 |
| 2005/0173714 A1* | 8/2005 | Lee et al. | 257/84 |
| 2005/0179130 A1* | 8/2005 | Tanaka et al. | 257/730 |
| 2005/0194628 A1* | 9/2005 | Kellar et al. | 257/296 |
| 2005/0199888 A1* | 9/2005 | Seong et al. | 257/79 |
| 2005/0205883 A1* | 9/2005 | Wierer et al. | 257/98 |
| 2005/0236636 A1* | 10/2005 | Hon et al. | 257/99 |
| 2005/0285121 A1* | 12/2005 | Kim, II | 257/79 |
| 2005/0285132 A1 | 12/2005 | Orita | |
| 2005/0285525 A1* | 12/2005 | Okada et al. | 313/582 |
| 2006/0027815 A1* | 2/2006 | Wierer et al. | 257/79 |
| 2006/0124954 A1* | 6/2006 | Akaishi | 257/99 |
| 2006/0209562 A1* | 9/2006 | Lee et al. | 362/606 |
| 2006/0234396 A1* | 10/2006 | Tomita et al. | 438/3 |
| 2006/0272572 A1* | 12/2006 | Uematsu et al. | 117/84 |
| 2007/0002566 A1* | 1/2007 | Wu et al. | 362/245 |
| 2007/0008478 A1* | 1/2007 | Lee et al. | 349/152 |
| 2007/0037306 A1* | 2/2007 | Chen | 438/22 |
| 2007/0096080 A1* | 5/2007 | Cain et al. | 257/40 |
| 2007/0115569 A1* | 5/2007 | Tang et al. | 359/831 |
| 2007/0165160 A1* | 7/2007 | Do et al. | 349/114 |
| 2007/0170441 A1* | 7/2007 | Takizawa et al. | 257/79 |
| 2007/0181889 A1* | 8/2007 | Orita | 257/79 |
| 2007/0205407 A1* | 9/2007 | Matsuo et al. | 257/13 |
| 2007/0217460 A1* | 9/2007 | Ishibashi et al. | 372/45.01 |
| 2007/0258268 A1* | 11/2007 | Kim et al. | 362/627 |
| 2008/0000522 A1* | 1/2008 | Johnson et al. | 136/255 |
| 2008/0012005 A1* | 1/2008 | Yang et al. | 257/40 |
| 2008/0023781 A1* | 1/2008 | Inujima et al. | 257/432 |
| 2008/0067916 A1* | 3/2008 | Hsu et al. | 313/498 |
| 2008/0185036 A1* | 8/2008 | Sasaki et al. | 136/252 |

FOREIGN PATENT DOCUMENTS

| | | |
|---|---|---|
| WO | WO 96/27225 A1 | 9/1996 |
| WO | WO 2006/013698 A1 | 2/2006 |

OTHER PUBLICATIONS

Ma et al: "A novel silicon bulk micromachining process for sub-millimetre rectangular waveguide fabrication" Proceedings of the SPIE—The International Society for Optical Engineering SPIE—Int. Soc. Opt. Eng USA, vol. 4407, 2001, pp. 372-379, XP002588488 ISSN: 0277-786X.

Mohan et al: "Realization of conductive InAs nanotubes based on lattice-mismatched InP/InAs core-shell nanowires" Applied Physics Letters, AIP, American Institute of Physics, Melville, NY, USLNKD-DOI:10.1063/1.2161576, vol. 88, No. 1, Jan. 5, 2006, pp. 13110-013110, XP012080415 ISSN: 0003-6951.

Motohisa et al: Growth of GaAs/AlGaAs hexagonal pillars on GaAs (111)B surfaces by selective-area MOVPE.Physica E Elsevier Netherlands, vol. 23, No. 3-4, Jul. 2004 pp. 298-304, XP002588487 ISSN:1386-9477.

* cited by examiner

POST STRUCTURE, SEMICONDUCTOR DEVICE AND LIGHT EMITTING DEVICE USING THE STRUCTURE, AND METHOD FOR FORMING THE SAME

This application claims the benefit of the Korean Patent Application No. 10-2006-0026632, filed on Mar. 23, 2006, which is hereby incorporated by reference as if fully set forth herein.

BACKGROUND OF THE INVENTION

1. Field of the Invention

The present invention relates to a post structure, a semiconductor device and a light emitting device using the structure, and a method for forming the same. More particularly, the present invention relates to a post structure, a semiconductor device and a light emitting device using the structure, and a method for forming the same, which is capable of forming the nanometer-scale post structure having a repetitive pattern by using an etching process.

2. Discussion of the Related Art

Recently, a semiconductor fabrication technology has been developed up to a newel level while overcoming several physical limits. It can be said that overcoming a spatial limit via a three-dimensional design is one of factors making such a development possible.

In the recent three-dimensional design for a semiconductor device, it has attempted to expand a unit structure to a three-dimensional structure, beyond the level of simply laminating identical repetitive two-dimensional structures one above another. This is a success in view of a greater capacity and surface area.

However, the three-dimensional design has a need for a very sophisticated photo-lithography method, and thus, suffers from excessive design costs and high process precision.

Moreover, a higher process precision is required to endow each unit pattern with a polygonal shape. Therefore, although such a newel technology can be realized, a degradation in productivity is inevitable. In conclusion, the newel three-dimensional design technology cannot be utilized in mass production.

Meanwhile, in the case of a light emitting device and a display device using the same, a technology for providing the light emitting device with a rough surface for the purpose of increasing light extraction efficiency of the device, or a technology for forming a nanometer-scale surface structure such as photonic crystal has been used.

To achieve the nanometer-scale surface structure, conventionally, a dry etching method has been mainly used. In particular, a GaN-based semiconductor diode device has a great difficulty in the implementation of a wet etching method because of an excessively high hardness of GaN.

However, the dry etching method has a problem in that a mask for covering a part of the structure to be etched is disappeared in the course of etching and thus, an etching height is inevitably limited according to the thickness of the mask. Moreover, due to the disappearance of the mask, there is a drawback in that the structure may have an inclined plane rather than being etched orthogonally.

For these reasons, there is the rise of a need for a method of forming a post structure suitable for mass production via a wet etching process because the wet etching process has no limit in etching height and etching time.

SUMMARY OF THE INVENTION

Accordingly, the present invention is directed to a post structure, a semiconductor device and a light emitting device using the structure, and a method for forming the same that substantially obviate one or more problems due to limitations and disadvantages of the related art.

A first object of the present invention is to provide a post structure, and a method for forming a semiconductor device using the post structure, in which the use of a dry etching process can be minimized and most of the dry etching process can be replaced by a wet etching process, resulting in an improvement in mass productivity, and enabling formation of a post structure having a high ratio of a vertical dimension to a horizontal dimension.

A second object of the present invention is to provide a light emitting device which has a photonic crystal structure capable of improving light extraction efficiency, thereby achieving high brightness and high light emitting efficiency, and a method for forming the light emitting device in which a thin film is grown over a dielectric post to improve the crystallinity of the thin film and control a stress in the thin film, resulting in an improvement in the light emitting efficiency of the light emitting device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with a first aspect of the invention, as embodied and broadly described herein, a method for forming a post structure comprising: forming unit patterns on a substrate by use of a first material; growing a wet-etchable second material on the substrate formed with the unit patterns; and wet etching the substrate having the grown second material.

In accordance with a second aspect of the invention, there is provided a method for forming a semiconductor device comprising: forming unit patterns on a substrate by use of a first material; growing a wet-etchable second material on the substrate formed with the unit patterns; wet etching the substrate having the grown second material, to form a post structure; forming a third material layer over the post structure; etching a plane formed with the third material layer; and removing at least a part of the post structure.

In accordance with a third aspect of the invention, there is provided a method for forming a light emitting device comprising: forming unit patterns on a substrate by use of a first material; growing a wet-etchable second material on the substrate formed with the unit patterns; wet etching the substrate having the grown second material, to form a post structure; forming a plurality of semiconductor layers in sequence on the substrate formed with the post structure; forming a first electrode on an uppermost one of the semiconductor layers; removing the substrate; and forming a second electrode on a lowermost one of the semiconductor layers that is exposed after removing the substrate.

In accordance with a fourth aspect of the invention, there is provided a post structure comprising: a substrate; unit patterns formed on the substrate by use of a first material; and a plurality of polygonal posts connected to the unit patterns, respectively, the posts being made of a second material.

In accordance with a fifth aspect of the invention, there is provided a light emitting device comprising: a plurality of semiconductor layers having a first plane and a second plane; a plurality of posts periodically arranged at the first plane of the semiconductor layers, each post having a protrusion protruded from the first plane; a first electrode located on the second plane of the semiconductor layers; and a second electrode located on the first plane of the semiconductor layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 1 to 10 are views illustrating a method for forming a post structure according to an embodiment of the present invention, in which;

FIG. 1 is a plan view illustrating unit patterns formed on a substrate;

FIG. 2 is a sectional view illustrating an example of unit patterns formed on the substrate;

FIG. 3 is a sectional view illustrating another example of unit patterns formed on the substrate;

FIG. 4 is a plan view illustrating a second material formed over the unit patterns;

FIG. 5 is a sectional view of FIG. 4;

FIG. 6 is a plan view illustrating an interfacing process of the second material;

FIG. 7 is a sectional view of FIG. 6;

FIG. 8 is an electron microscope photograph illustrating the interfaced second material;

FIG. 9 is an electron microscope photograph illustrating an initial etching stage; and FIG. 10 is an electron microscope photograph illustrating a post structure;

FIGS. 14 to 16 are sectional views illustrating a process for forming a capacitor for use in a memory device using the post structure according to the present invention, in which;

FIG. 14 is a sectional view illustrating an oxide post structure;

FIG. 15 is a sectional view illustrating poly silicone formed over the post structure; and FIG. 16 is a sectional view illustrating the capacitor for the memory device.

DETAILED DESCRIPTION OF THE INVENTION

Figure 1:
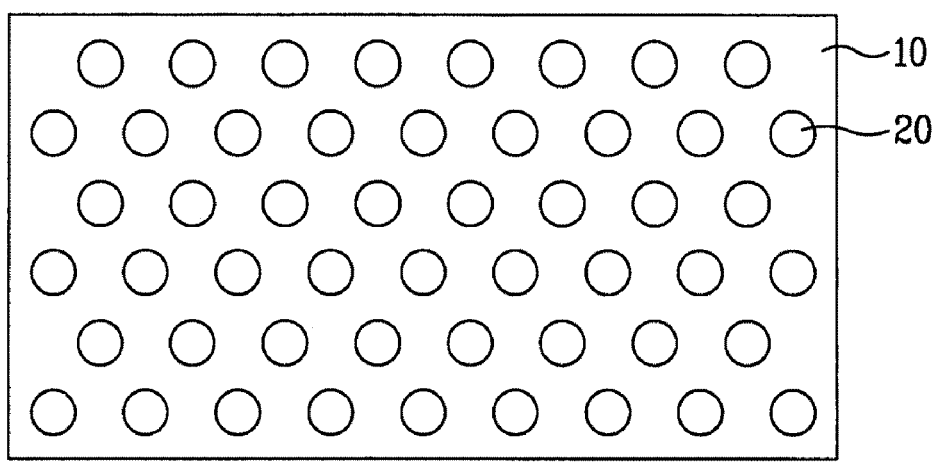

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims The same reference numbers will be used throughout the drawings to refer to the same or like parts. In the drawings, dimensions of layers and regions are exaggerated for clarity of description.

It will be understood that, when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

The above terms first, second, etc. are used simply to discriminate any one element, component, region, layer, or area from other elements, components, regions, layers, or areas. Accordingly, the term first region, first layer, first area, etc., which will be described hereinafter, may be replaced by the term second region, second layer, or second area.

FIG. 1 illustrates an array of basic unit patterns 20 formed on a substrate 10. The array of the initial unit patterns 20 is a factor of determining the cross sectional shape of a post structure that will be formed in a following process (See FIG. 10). Also, a vertical height difference between the unit patterns 20 and the substrate 10 is a factor of determining a lateral growth rate of the post structure.

The substrate 10 may be made of, but not limited to, a material having a high hardness, such as sapphire and GaN semiconductor, or a silicon-based material, such as SiC and Si.

The unit patterns 20 may be made of a material different from the material of the substrate 10, or may be made of the same material as the material of the substrate 10.

Preferably, a layer, which is made of a material different from or the same as the material of the substrate 10, is formed on the substrate 10 to have an appropriate thickness, for achieving a vertical height difference between the layer and the substrate 10. Thereafter, the layer is etched to form the unit patterns 20. In this case, a dry etching process may be used.

Figure 2:
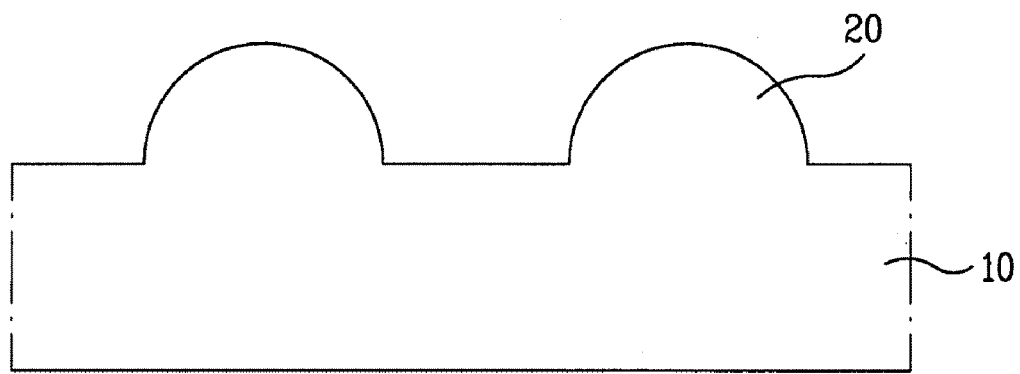
Figure 3:
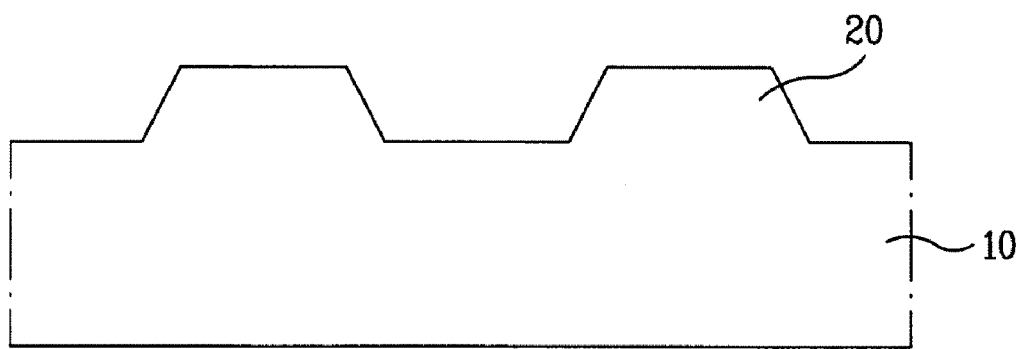

Although the shape of a vertical cross section of the unit patterns 20 is may not be a factor having a great effect on the growth of a post structure, it is known that a semi-circular shape as shown in FIG. 2 or a trapezoidal shape as shown in FIG. 3 is more efficient for the vertical growth of polygonal posts.

Of course, in addition to the above mentioned semi-circular and trapezoidal shapes, an arc shape, a partial elliptical shape, etc. are also possible.

Hereinafter, the unit patterns 20, the vertical cross section of which has the semi-circular shape as shown in FIG. 2, will be described.

Once the unit patterns 20 are formed on the substrate 10 as described above, as shown in FIGS. 4 and 5, a wet-etchable material 30 is grown on a surface of the substrate 10 where the unit patterns 20 are formed.

The wet-etchable material 30 will be used to form a post structure. The growth of the wet-etchable material 30 may be accomplished by use of a deposition method. Preferably, the wet-etchable material 30 is grown by use of a chemical vapor deposition (CVD), etc. showing active lateral growth or active all-directional growth.

Although the constituent material (first material) of the unit patterns 20 have to be different from the wet-etchable material 30 (second material), it is preferable that different materials, which have a high selectivity relative to a wet etchant, be used for selective etching.

The second material 30 may be an oxide or nitride, for example, silicon oxide ($SiO_2$), silicon nitride (SiN), etc.

Figure 6:
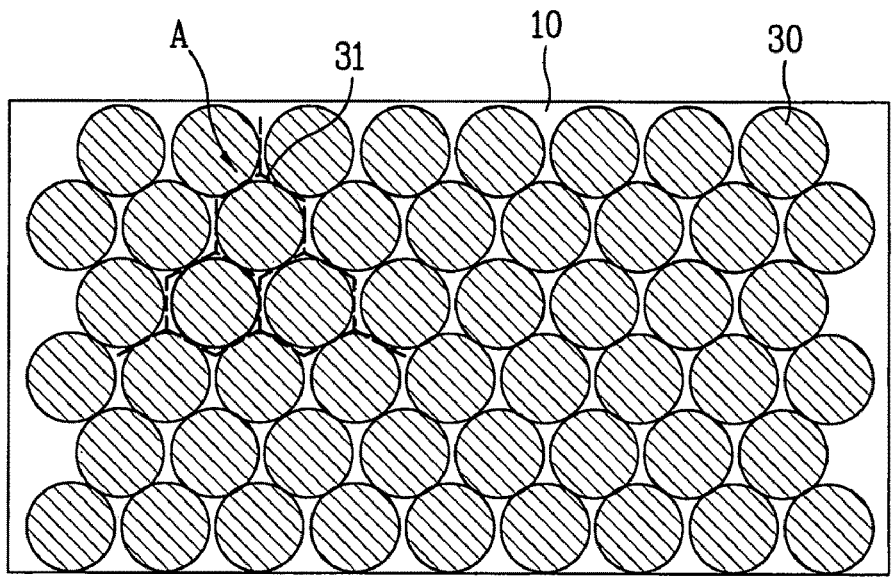
Figure 7:
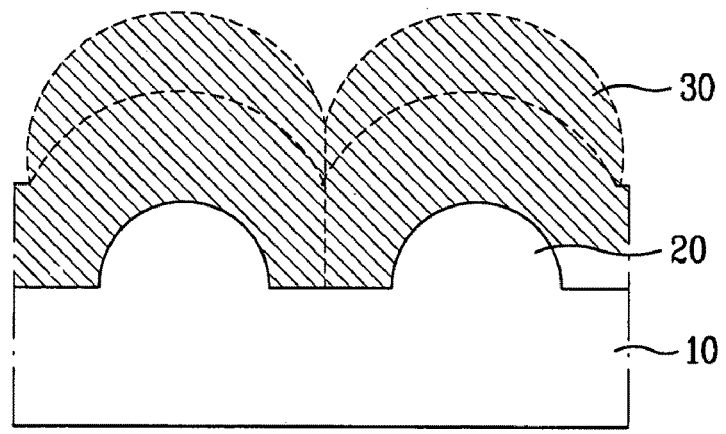

If the growth of the second material 30 is continued, as shown in FIGS. 6 and 7, boundaries of the second materials 30 formed on the respective unit patterns 20 come into contact with one another.

As shown in the dashed portion A of FIG. 6, if the boundaries of the respective second materials 30 meet one another, a new interface 31 is created, resulting in new patterns different from the unit patterns 20.

In this case, assuming that the second materials 30 to be deposited have a uniform horizontal growth in all directions, the shape of the new patterns follow the array of the initial unit patterns 20.

Figure 4:
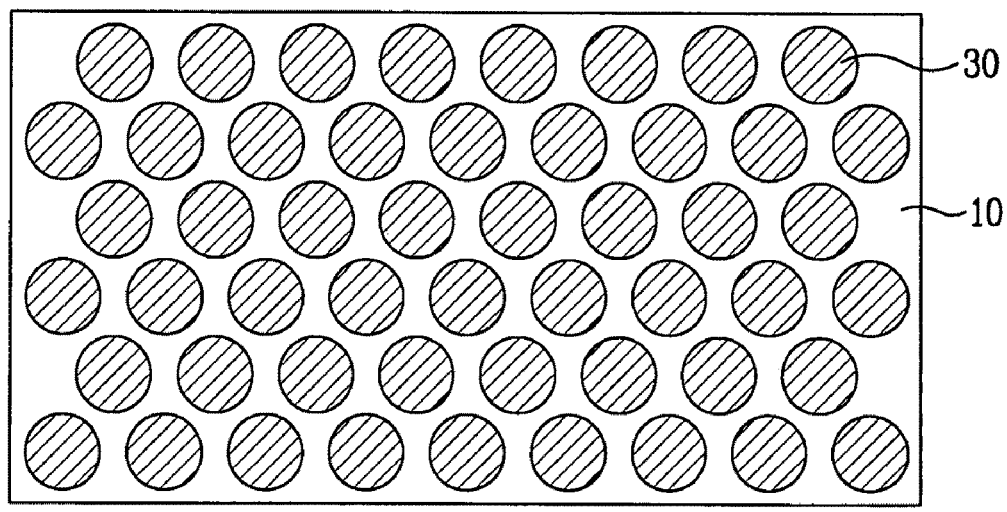
Figure 5:
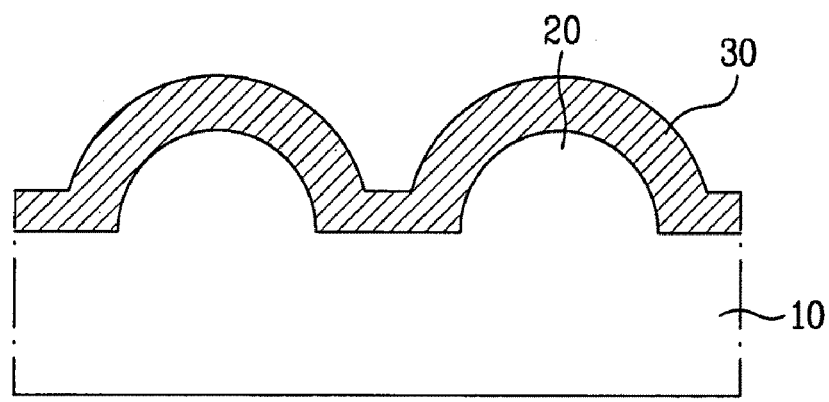
Figure 8:
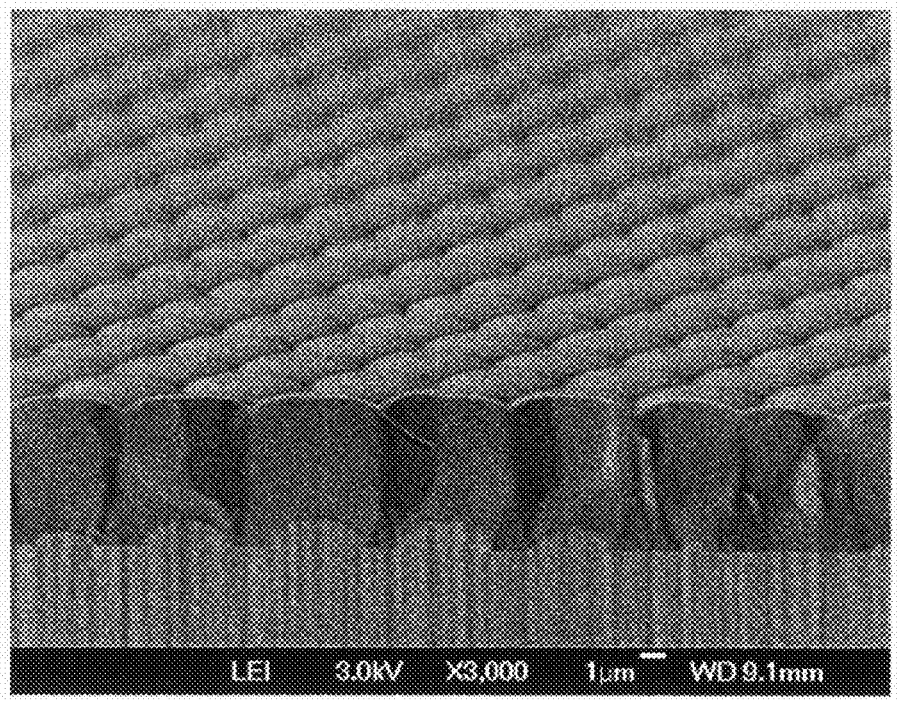

For example, referring to FIG. 4, the second materials 30 on the respective unit patterns 20 initially have a semi-circular cross section and are arranged alternately with one another. However, since the new interface of the second materials 30 has a hexagonal array as shown in FIG. 6, the resulting final patterns have a regular hexagonal shape (in the horizontal cross section) as shown in FIG. 8. FIG. 8 is an electron microscope photograph illustrating the newly formed interface.

Alternatively, assuming that the second materials 30 on the respective unit patterns 20 are initially arranged perpendicular to one another with a predetermined distance, the resulting new patterns may have a square or octagonal cross section.

Figure 9:
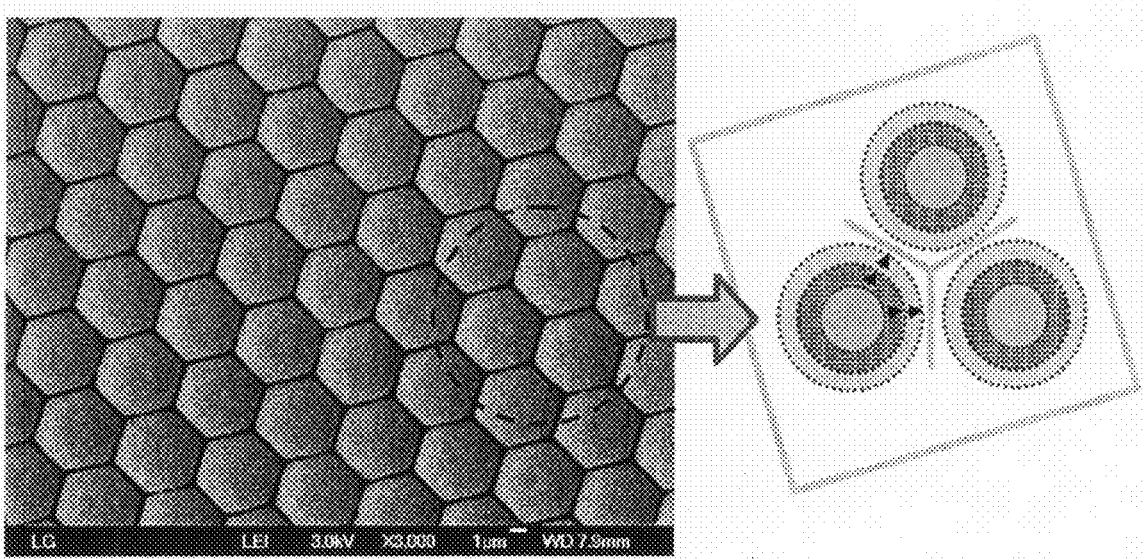

FIG. 9 illustrates an experimental result obtained after performing a wet etching process on the patterns shown in FIG. 8 for 1 minute. If the patterns shown in FIG. 8 are wet-etched, the wet etching is actively performed along the interface between the patterns, as shown in the right-side of FIG. 9 in enlarged scale. This is because the interface, which is defined as materials having opposite growth directions meet each other, is more unstable in etching than other portions of the patterns.

Figure 10:
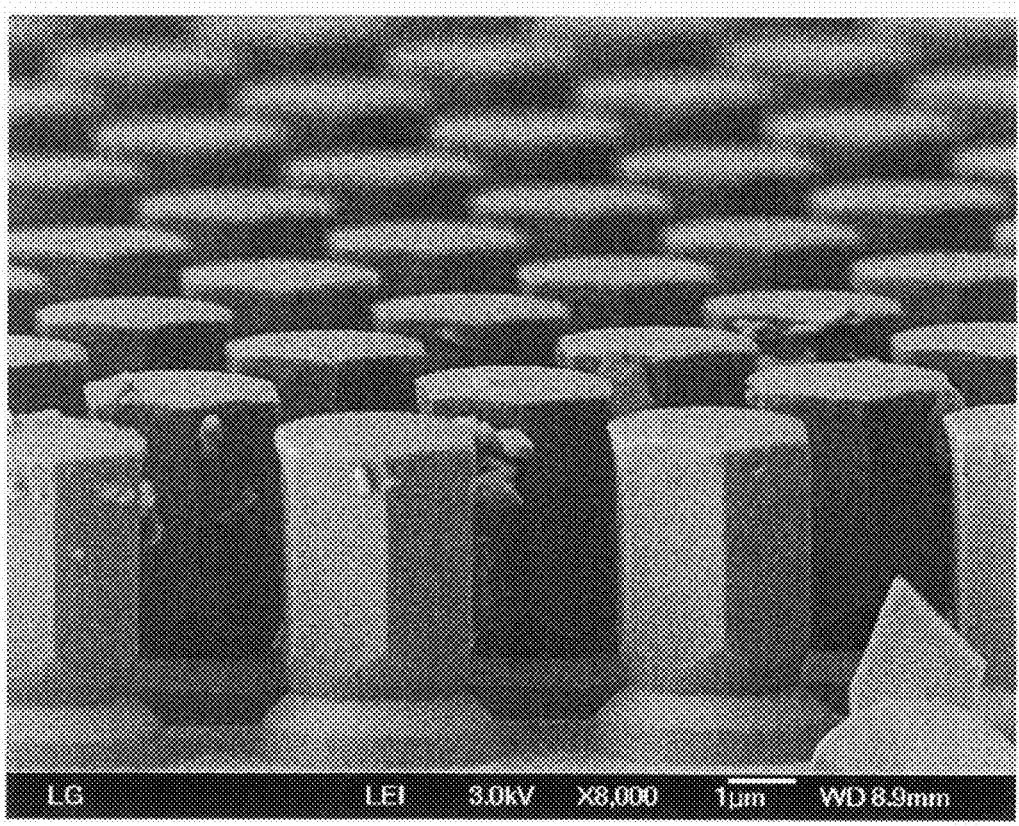

FIG. 10 is an electron microscope photograph illustrating a post structure obtained by performing a wet etching process on the interface as shown in FIG. 8 until the substrate 10 is exposed.

A wet etching rate is faster than a dry etching rate. Accordingly, as shown in FIG. 10, the post structure includes vertical posts, which substantially have no inclined surface and can maintain the shape of edges of a hexagonal post.

Figure 11:
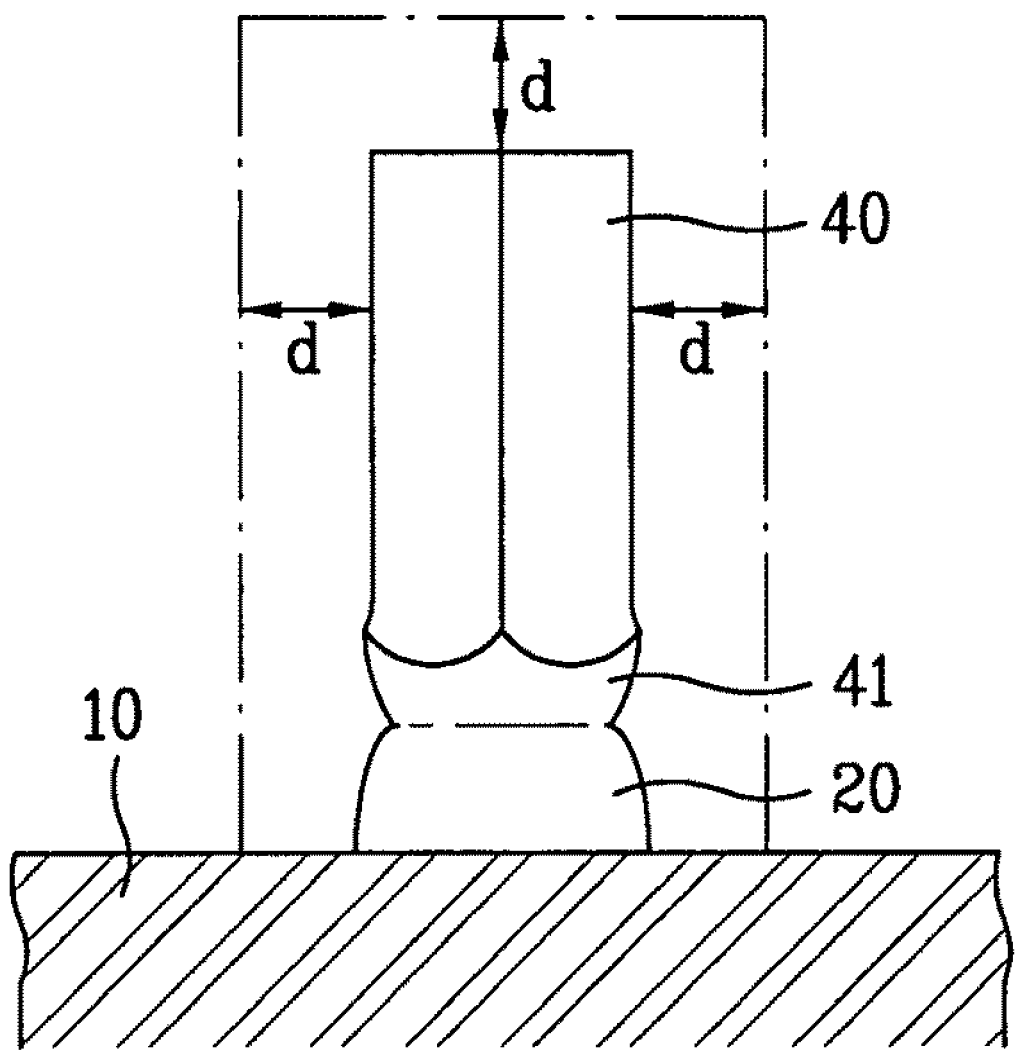
FIG. 11 is a side view illustrating a post structure according to an embodiment of the present invention.

FIG. 11 illustrates one of a plurality of posts constituting the post structure formed by the wet etching process. The height and diameter of each post 40 of the post structure are adjustable according to a wet etching time. Also, the height and diameter of the post 40 may be adjusted according to a distance between the initial unit patterns 20, the array of the unit patterns 20, and a deposition height of the second material 30.

FIG. 11 also illustrates a reduction rate in the height and diameter of the post 40 by the wet etching process. When the post 40 is etched by a height d, the post 40 has a diameter reduction of 2d as the post 40 is etched in opposite directions. Accordingly, on the basis of such a principle, it is possible to form the post structure having a nanometer scale.

That is to say, even if the initially formed unit pattern 20 or the second materials 30 on the respective unit patterns 20 have a micrometer scale diameter, the nanometer scale patterns can be formed by appropriately regulating an etching time.

If the wet etching process is performed until the substrate 10 is exposed, the initially formed unit patterns 20 also may be exposed. In this case, a diameter-reduced portion 41, which has a diameter smaller than an outer diameter of the post 40, may be formed between the post 40 and the unit pattern 20. This can be construed as a kind of undercut phenomenon.

Conventionally, the etching is actively performed in a portion having an unstable interface structure. Accordingly, the etching can be more actively performed at a contact surface between the unit pattern 20 and the second material 30, more particularly, at a beginning portion of the post 40.

In the above described method according to the present invention, the use of the dry etching process is minimized and most of the dry etching process is replaced by the wet etching process. Accordingly, the present invention has the effect of achieving the maximum mass productivity.

Meanwhile, the post structure, formed on the substrate 10, may be utilized in a nano-imprint photo-lithography process. In the nano-imprint photo-lithography process, the posts 40 may be used as nano-rods, which are usable to perforate appropriate slits or holes in a photo-lithography shadow mask.

Namely, the photo-lithography shadow mask is able to be formed by mechanically forming the holes in the mask with the nano rods, and subsequently, hardening the mask.

Figure 12:
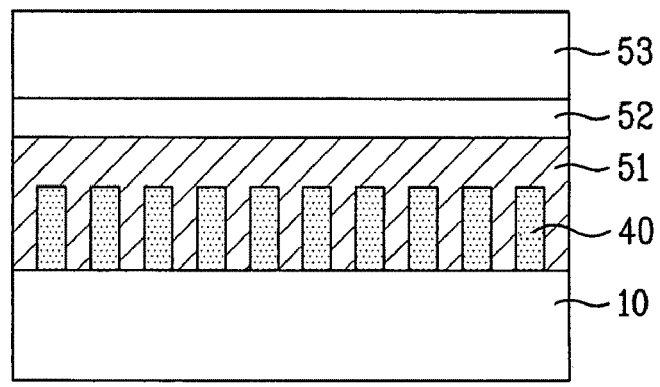
FIG. 12 is a sectional view illustrating a manufacturing procedure of a light emitting device having the post structure according to the present invention.

FIG. 12 illustrates an embodiment in which the above described post structure is used in a light emitting device having vertical structure.

To fabricate the vertical light emitting device, first, the post structure is formed on the substrate 10 by use of the above described method.

Specifically, similar to the above description, unit patterns are formed on the substrate 10, and a second dielectric material is coated over the unit patterns such that the interface of the second materials on the respective unit patterns come into contact with one another to thereby have a predetermined thickness. Thereafter, the second material is subjected to the wet etching process, to form the post structure.

In this case, the substrate 10 may be made of one of sapphire, SiC, Si, ZnO, etc. Also, prior to forming the unit patterns, a GaN-based semiconductor layer may be formed on the substrate 10.

Subsequently, a plurality of semiconductor layers 51, 52, and 53 are formed in sequence, covering the post structure. That is, a semiconductor layer having a multi-layer 51, 52, and 53 structure is formed on the post structure. Preferably, the semiconductor layers include an n-type semiconductor layer 51, a light emitting layer (active layer) 52, and a p-type semiconductor layer 53. As shown, the n-type semiconductor layer 51 may be formed to cover an outer surface of the post structure.

The semiconductor layers 51, 52, and 53 may be formed by use of GaN-based semiconductor layers ($Al_xIn_yGa_{1-x-y}N$, $0 \leq x, y \leq 1$).

Then, a first electrode 61 is formed over the semiconductor layers 51, 52, and 53. As occasion demands, a supporting layer 60, which is made of a metal or Si substrate, is formed over the first electrode 61 (See FIG. 13).

In this case, the first electrode 61 is a p-type electrode (ohmic electrode), and a reflective electrode may be additionally formed over the p-type electrode. In addition, a metal pad 63 may be formed at an outer surface of the supporting layer 60.

Thereafter, the substrate 10 is removed. A plane, which is revealed after removing the substrate 10, is chemically or physically processed. An n-type electrode 62 as a second electrode is formed on the revealed plane.

Figure 13:
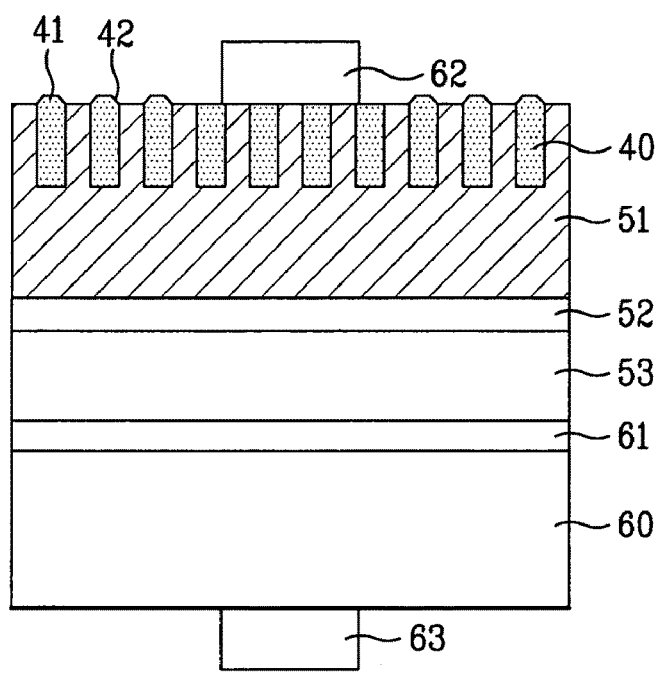
FIG. 13 is a sectional view of the light emitting device having the post structure according to an embodiment of the present invention.

With the above described procedure, a light emitting device having a structure as shown in FIG. 13 is obtained. In this case, the post structure is exposed to the outside from the plane revealed after removing the substrate 10. The post structure can serve to improve light extraction efficiency of the light emitting device. If the posts 40 of the post structure have an appropriate size and are arranged with an appropriate distance, a desired photonic crystal structure can be obtained.

As shown, the protrusion 41, which is formed at an end of each post 40, may protrude outward from a surface of the n-type GaN layer 51. The protrusion 41 has a vertical cross section of an arc shape, partial elliptical shape, trapezoidal shape, or the like.

As shown in FIG. 13, with the above described procedure, the protrusion 41, formed at the post 40, may have an inclined surface 42.

The protrusion 41 serves to provide the light emitting device with a rough surface and a polyhedral structure, resulting in an improvement in the light emitting efficiency of the light emitting device.

Figure 14:
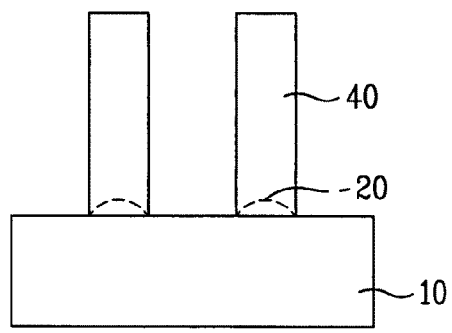
Figure 15:
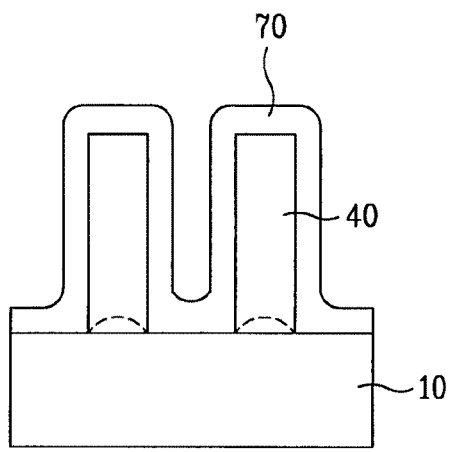

Meanwhile, the above described post structure may be used to form a capacitor for use in a semiconductor memory device, etc. Specifically, as shown in FIG. 14, after forming the unit patterns 20 on the silicon substrate 10 and forming the post structure by use of an oxide, as shown in FIG. 15, a polycrystalline silicon layer 70 is deposited over the post structure.

Thereafter, if the plane, on which the polycrystalline silicon layer 70 is deposited, is subjected to a dry etching process until the etching height is equal to the thickness of the deposited polycrystalline silicon, an upper surface of each oxide post 40 is exposed. However, a portion of the deposited polycrystalline silicon layer 70, around a sidewall of the post 40, has a relatively large thickness and thus, remains almost after completion of the dry etching process.

Figure 16:
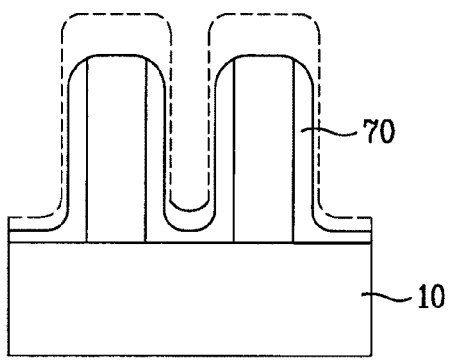

Then, if at least a portion of the oxide posts 40 are removed by use of an etchant, such as buffered oxide etchant (BOE) or hydrogen fluoride (HF), as shown in FIG. 16, a polycrystalline silicon pipe structure is revealed. The polycrystalline silicon pipe structure can be used to form a capacitor for use in a semiconductor memory device.

The above capacitor, as shown in FIG. 16, has a stable structure. When using the stable capacitor structure, it is possible to solve a conventional problem in that a lower end of the capacitor is easily damaged due to a small diameter thereof.

In addition to forming the above described capacitor for use in a memory device, the present invention can be widely applied to a nano-indentor, a nano-imprinting mold, a PCB's surface pattern, etc.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device, comprising:
    a semiconductor structure having a first surface and a second surface;
    a light extraction structure including a plurality of holes arranged on the first surface of the semiconductor structure, and a transparent material disposed inside at least one of the plurality of holes;
    a first electrode located on the second surface of the semiconductor structure;
    a second electrode located on the first surface of the semiconductor structure; and
    a supporting layer located on the first electrode, the supporting layer including a metallic element or a semiconductor element,
    wherein the transparent material comprises a dielectric,
    wherein a part of the transparent material extends outside of the at least one hole and has an inclined portion with respect to the first surface, and
    wherein the transparent material is configured to enhance a light extraction efficiency of the light emitting device.

2. The light emitting device according to claim 1, wherein the semiconductor structure comprises:
    a first conductive semiconductor layer;
    a light emitting layer located on the first conductive semiconductor layer; and
    a second conductive semiconductor layer located on the light emitting layer.

3. The light emitting device according to claim 1, wherein a vertical cross section of the part of the transparent material has one of an arc shape, a partial elliptical shape, and a trapezoidal shape.

4. The light emitting device according to claim 1, wherein the inclined portion is located proximate to a wall inside of the at least one hole.

5. The light emitting device according to claim 1, wherein the dielectric is an oxide or a nitride.

6. The light emitting device according to claim 1, wherein the transparent material comprises silicon oxide ($SiO_2$) or silicon nitride (SiN).

7. The light emitting device according to claim 1, wherein the part of the transparent material has a surface substantially parallel with the first surface.

8. The light emitting device according to claim 1, wherein the second electrode is located on a substantially flat portion of the first surface.

9. The light emitting device according to claim 1, wherein the plurality of holes are periodically distributed.

10. The light emitting device according to claim 1, wherein the first electrode comprises:
    a first conductive electrode; and
    a reflective electrode located on the first conductive electrode.

11. The light emitting device according to claim 1, further comprising:
    a metal pad on the supporting layer.

12. The light emitting device according to claim 1, wherein the semiconductor structure comprises GaN-based semiconductor layers.

13. The light emitting device according to claim 1, wherein the part of the transparent material is configured to enhance the light extraction efficiency of the device.

14. The light emitting device according to claim 1, wherein the transparent material is entirely filled inside of the at least one hole.

15. The light emitting device according to claim 1, wherein the inclined portion has a substantially flat surface.

16. The light emitting device according to claim 1, wherein the inclined portion contacts a wall inside of the at least one hole.

17. The light emitting device according to claim 1, wherein a size scale of the at least one hole is micro-meter scale or nano-meter scale.

18. The light emitting device according to claim 1, wherein a wall inside of the at least one hole is substantially perpendicular to the first surface.

19. The light emitting device according to claim 1, wherein areas of the first surface and the second surface are substantially identical.

20. The light emitting device according to claim 1, wherein a surface area of the supporting layer facing the semiconductor structure is substantially identical to an area of the second surface.

21. The light emitting device according to claim 1, wherein the supporting layer contacts the first electrode.

22. The light emitting device according to claim 1, wherein the second electrode is located on the transparent material.

23. The light emitting device according to claim 1, wherein the transparent material is partially disposed on the first surface.

* * * * *